(12) United States Patent
Nassler et al.

(10) Patent No.: US 10,390,467 B2
(45) Date of Patent: Aug. 20, 2019

(54) HOUSING, CIRCUIT ARRANGEMENT, DRIVE ARRANGEMENT AND METHOD FOR PRODUCING THE CIRCUIT ARRANGEMENT

(71) Applicant: Conti Temic microelectronic GmbH, Nuremberg (DE)

(72) Inventors: Christian Nassler, Nuremberg (DE); Thomas Voelkl, Nuremberg (DE)

(73) Assignee: CONTI TEMIC MICROELECTRONIC GMBH, Nuremberg (DE)

( * ) Notice: Subject to any disclaimer, the term of this patent is extended or adjusted under 35 U.S.C. 154(b) by 968 days.

(21) Appl. No.: 14/787,073

(22) PCT Filed: Apr. 16, 2014

(86) PCT No.: PCT/EP2014/057841
§ 371 (c)(1),
(2) Date: Oct. 26, 2015

(87) PCT Pub. No.: WO2014/173790
PCT Pub. Date: Oct. 30, 2014

(65) Prior Publication Data
US 2016/0100510 A1 Apr. 7, 2016

(30) Foreign Application Priority Data
Apr. 26, 2013 (DE) .................. 10 2013 207 673

(51) Int. Cl.
*H05K 9/00* (2006.01)
*H02K 5/22* (2006.01)
(Continued)

(52) U.S. Cl.
CPC ............... *H05K 9/002* (2013.01); *H02K 5/22* (2013.01); *H02K 11/0005* (2013.01);
(Continued)

(58) Field of Classification Search
CPC .... H05K 1/00; H05K 1/41–44; H05K 1/0218; H05K 9/00; H05K 9/003; H05K 9/033
(Continued)

(56) References Cited

U.S. PATENT DOCUMENTS 3,721,746 A * 3/1973 Knappenberger ... H05K 9/0032
174/372
4,645,611 A 2/1987 Campbell et al. ..... 252/62.51 R
(Continued)

FOREIGN PATENT DOCUMENTS

DE 3937190 A1 5/1991 ............. B60R 16/02
DE 202007015360 U1 3/2009 ............... H05K 9/00
(Continued)

OTHER PUBLICATIONS

German Office Action, Application No. 102013207673.8, 5 pages, dated Nov. 4, 2013.
(Continued)

*Primary Examiner* — Tuan T Dinh
(74) *Attorney, Agent, or Firm* — Slayden Grubert Beard PLLC

(57) ABSTRACT

A housing for a circuit assembly includes a housing interior chamber, an electromagnetic radiation-impermeable partition wall that divides the housing interior chamber into (a) a first housing interior chamber partial region configured to receive a first electrical component designed as a filter component and (b) a second housing interior chamber partial region configured to receive a second electrical component, an electromagnetic radiation-impermeable cover plate, and an electromagnetic radiation-impermeable housing section directly adjacent to the first housing interior chamber region. The partition wall, the cover plate, and the housing section enclose the first housing interior chamber partial region in three dimensions, creating a complete electromagnetic
(Continued)

shielding of the first housing interior chamber partial region from the second housing interior chamber partial region. A circuit assembly having such a housing can be cost-effectively produced and has a reduced scope.

15 Claims, 2 Drawing Sheets

(51) Int. Cl.

| | | |
|---|---|---|
| H02K 11/00 | (2016.01) | |
| H02K 11/02 | (2016.01) | |
| H05K 3/30 | (2006.01) | |
| H05K 3/32 | (2006.01) | |
| H05K 5/02 | (2006.01) | |
| H05K 7/02 | (2006.01) | |

(52) U.S. Cl.
CPC ....... *H02K 11/0073* (2013.01); *H02K 11/024* (2013.01); *H05K 3/30* (2013.01); *H05K 3/32* (2013.01); *H05K 5/0239* (2013.01); *H05K 5/0247* (2013.01); *H05K 7/02* (2013.01); *H05K 9/0037* (2013.01)

(58) Field of Classification Search
USPC ................ 361/752–753, 756–759, 816, 818; 174/350–355
See application file for complete search history.

(56) References Cited

U.S. PATENT DOCUMENTS

| | | | | |
|---|---|---|---|---|
| 4,717,990 | A | 1/1988 | Tugcu | ............................ 361/816 |
| 5,245,221 | A * | 9/1993 | Schmidt | ............... A61H 33/005 |
| | | | | 307/112 |
| 5,253,143 | A | 10/1993 | Klinger et al. | ............... 361/736 |
| 5,414,597 | A | 5/1995 | Lindland et al. | ............. 361/816 |
| 6,476,463 | B1 * | 11/2002 | Kaneko | ................. H01L 23/552 |
| | | | | 257/660 |
| 6,747,879 | B2 * | 6/2004 | Baker | ................. H05K 1/0218 |
| | | | | 361/753 |
| 7,326,862 | B2 * | 2/2008 | Lionetta | ................. H05K 9/003 |
| | | | | 174/370 |
| 2013/0021771 | A1 | 1/2013 | Goto | ............................. 361/816 |
| 2015/0194898 | A1 | 7/2015 | Shinohara et al. | ............. 363/17 |

FOREIGN PATENT DOCUMENTS

| | | | | |
|---|---|---|---|---|
| EP | 1727280 | A2 | 11/2006 | ............... H03H 1/00 |
| JP | 0677681 | B2 | 10/1994 | ............. B01F 17/00 |
| JP | 2000252678 | A | 9/2000 | ............... H04B 1/08 |
| JP | 2001044685 | A | 2/2001 | ............... H03H 7/01 |
| JP | 2004281718 | A | 10/2004 | ............... H05K 5/00 |
| JP | 2005123344 | A | 5/2005 | ............... H05K 9/00 |
| JP | 2006180578 | A | 7/2006 | ............. H02M 3/28 |
| WO | 2014/021035 | A1 | 2/2014 | ............. H02M 3/28 |
| WO | 2014/173790 | A1 | 10/2014 | ............... H05K 9/00 |

OTHER PUBLICATIONS

International Search Report and Written Opinion, Application No. PCT/EP2014/057841, 42 pages, dated Aug. 13, 2014.

Chinese Office Action, Application No. 201480023535.9, 12 pages, dated Jun. 13, 2018.

Japanese Office Action, Application No. 2016509397, 4 pages, dated Oct. 10, 2017.

German Office Action, Application No. 102013207673.8, 6 pages, dated Apr. 25, 2018.

\* cited by examiner

HOUSING, CIRCUIT ARRANGEMENT, DRIVE ARRANGEMENT AND METHOD FOR PRODUCING THE CIRCUIT ARRANGEMENT

CROSS-REFERENCE TO RELATED APPLICATIONS

This application is a U.S. National Stage Application of International Application No. PCT/EP2014/057841 filed Apr. 16, 2014, which designates the United States of America, and claims priority to DE Application No. 10 2013 207 673.8 filed Apr. 26, 2013, the contents of which are hereby incorporated by reference in their entirety.

TECHNICAL FIELD

The present invention relates to a housing for a circuit arrangement and to a circuit arrangement having the mentioned housing. In addition, the invention relates to a drive arrangement having the mentioned circuit arrangement. In addition, the invention relates to a method for producing the mentioned circuit arrangement.

BACKGROUND

Circuit arrangements, in particular power converters of a drive arrangement of a vehicle, comprise electrical or electronic components which generate electromagnetic interference fields during operation of the circuit arrangements. These circuit arrangements furthermore comprise further electrical or electronic components which respond sensitively to electromagnetic interference fields, for which reason said components are provided with individual electromagnetic shields for protection from these interference fields. However, this procedure is complicated.

SUMMARY

One embodiment provides a housing for a circuit arrangement, the housing comprising: a housing interior; a separating wall which is impermeable to electromagnetic radiation and which divides the housing interior spatially into a first housing interior subregion and a second housing interior subregion, wherein the first housing interior subregion is designed to accommodate a first electrical component in the form of a filter component, and the second housing interior subregion is designed to accommodate a second electrical component; a covering plate which is impermeable to electromagnetic radiation; and a housing section, which is impermeable to electromagnetic radiation and which directly adjoins the first housing interior subregion; wherein the separating wall, the covering plate and the housing section surround the first housing interior subregion three-dimensionally, as a result of which complete electromagnetic shielding of the first housing interior subregion from the second housing interior subregion is provided.

In a further embodiment, the covering plate, the separating wall and the housing section are electrically conductively and mechanically connected to one another.

In a further embodiment, the covering plate, the separating wall and/or the housing section are designed to be electrically conductively connected to an electrical terminal of the first component.

In a further embodiment, the covering plate is designed to be electrically conductively and mechanically connected directly to the first component via the electrical terminal.

In a further embodiment, the separating wall, the covering plate and/or the housing section comprise electrically conductive and/or soft-magnetic material.

In a further embodiment, the separating wall, the covering plate and/or the housing section are formed from the same electrically conductive and/or soft-magnetic material.

In a further embodiment, the separating wall and the housing section are formed integrally.

In a further embodiment, the separating wall envelopes the first housing interior subregion.

Another embodiment provides a circuit arrangement including the housing as described above, the first electrical component in the form of a filter component, arranged in the first housing interior subregion, and the second electrical component, arranged in the second housing interior subregion.

In a further embodiment, the first component has an electrical terminal for producing an electrically conductive connection to an electrical ground potential and is electrically conductively connected directly via this electrical terminal to the covering plate, the separating wall or the housing section.

In a further embodiment, the first component is fastened on the covering plate via a mechanical connection, wherein this mechanical connection at the same time forms an electrical connection, which electrically conductively connects the electrical terminal of the first component to the covering plate.

In a further embodiment, the first component is in the form of a capacitor or a coil.

Another embodiment provides a drive arrangement for a vehicle, which drive arrangement has an electric machine for driving the vehicle, wherein the drive arrangement additionally has a circuit arrangement as discussed above, which circuit arrangement is connected to the electric machine via an electrical connection and is designed to provide electrical energy for the electric machine.

Another embodiment provides a method for producing a circuit arrangement as discussed above, wherein the method includes producing an electrically conductive mechanical connection between the first electrical component and the covering plate; and fastening the covering plate to the separating wall and/or the housing section once the electrically conductive mechanical connection between the first component and the covering plate has been produced.

In a further embodiment, the electrically conductive mechanical connection between the first electrical component and the covering plate is produced with the aid of an electrically conductive mechanical connection between the electrical terminal of the first electrical component and the covering plate, wherein the electrical terminal is designed to produce an electrically conductive connection to an electrical ground potential.

BRIEF DESCRIPTION OF THE DRAWINGS

Example embodiments of the invention are explained in more detail below with reference to the attached drawings, in which.

DETAILED DESCRIPTION

Figure 1:
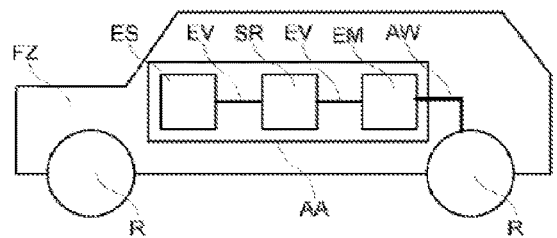
FIG. 1 shows a schematic illustration of a vehicle comprising a drive arrangement having a circuit arrangement in accordance with one embodiment.

Embodiments of the present invention provide an inexpensive possible way of electromagnetically shielding the electromagnetically sensitive components.

One embodiment provides a housing for a circuit arrangement that comprises a housing interior and a separating wall which is impermeable to electromagnetic radiation and which divides the housing interior spatially into a first and a second housing interior subregion. In this case, the first housing interior subregion is designed to accommodate a first electrical component in the form of a filter component. Similarly, the second housing interior subregion is designed to accommodate a second electrical or electronic component. The housing furthermore comprises a covering plate which is impermeable to electromagnetic radiation. In addition, the housing comprises a housing section which is impermeable to electromagnetic radiation. In this case, the housing section directly adjoins the first housing interior subregion. In particular, the housing section forms at least one wall, which delimits the housing interior subregion. In an assembled state of the housing, the separating wall, the covering plate and the housing section surround the first housing interior subregion three-dimensionally (i.e. spatially) in such a way that the separating wall, the covering plate and the housing section form complete electromagnetic shielding of the first housing interior subregion with respect to the second housing interior subregion or with respect to the surrounding environment.

In this case, the term "electromagnetic radiation" is understood to mean in particular electrical or electromagnetic fields such as occur, for example as electromagnetic interference fields, during operation of current or voltage transformers. Such interference fields cover frequencies of up to 1 GHz, preferably from 50 kHz to 300 MHz, in particular from 150 kHz to 50 MHz.

The wording "impermeable to electromagnetic radiation" in this application means that electromagnetic interference fields which can trigger functional faults in the electrical or electronic components, in particular in the filter components of an EMC (electromagnetic compatibility) filter, are correspondingly absorbed or damped by the separating wall, the covering plate and the housing section so that said electromagnetic interference fields do not reach the respective components or do not reach said components with an intensity that can trigger functional faults in the respective components. The absorption or damping of these interference fields is at least 40 dB, preferably at least 50 dB, or 60 dB, in particular 80 dB in a frequency range of the interference fields of between 10 kHz or 1 MHz to 30 MHz, for example.

The wording "three-dimensionally surround the first housing interior subregion" in this application means that the mentioned housing interior subregion is completely surrounded or enveloped three-dimensionally by enveloping or surrounding parts only apart from two or more openings, which are necessarily required for passing through electrical connections required for the functionality of the first component into this housing interior subregion. This surrounding arrangement results in the shielding, which, in particular from a technical point of view, can be considered to be complete. In this case, the term "complete" relates in particular to the function of the shielding, namely the suppression of functional interference owing to electromagnetic interference fields within the shield which are generated outside the shield.

In this case, the openings are arranged at points on the enveloping or surrounding parts which, in relation to the parts, are remote from sources of the abovementioned electromagnetic interference fields. As a result, the electromagnetic interference fields are largely absorbed or damped by the enveloping or surrounding parts before they pass to the openings.

The wording "complete electromagnetic shielding" means shielding of the electrical or electronic components from the electrical or electromagnetic interference fields, wherein the interference fields are completely or virtually completely absorbed or damped by the enveloping or surrounding parts. As a result, the electromagnetic interference fields do not pass to the mentioned components or not with an intensity that can trigger functional faults in the components. "Complete" shielding is achieved in particular in a frequency range of the interference fields of between 10 kHz or 1 MHz to 30 MHz.

The housing section is part of the housing, preferably comprises part of a housing side wall of the housing and/or part of a housing base of the housing and spatially delimits the first housing interior subregion from the second housing interior subregion and from the surrounding environment of the housing. The housing section is thus formed by a wall section of the housing. Preferably, the housing section is flat.

Aspects of the invention are based on the consideration that electromagnetic shielding of the first components of a circuit arrangement which respond in a sensitive manner to the electromagnetic interference fields with respect to the second components of the circuit arrangement which generate electromagnetic interference fields can be achieved if the electromagnetic field fluxes from the second components to the first components are damped or weakened.

In this case, it is conceivable to provide these first components with electromagnetically shielding housings. Conversely, the second components which generate electromagnetic interference fields can be provided with corresponding electromagnetically shielding housings.

Providing the first and/or the second components with corresponding electromagnetically shielding housings would be costly, however, and would also excessively enlarge the entire circumference of the components, which would in turn require a greater amount of installation space in the circuit arrangement.

In order to achieve an inexpensive solution which saves on installation space for at least identically effective electromagnetic shielding between the first and second components, it has been identified within the scope of this invention to divide the housing interior, which accommodates both the first and the second components, into at least two housing interior subregions and to arrange the first and second components separately in these two housing interior subregions.

It has furthermore been identified that effective electromagnetic shielding of the first housing interior subregion from the second housing interior subregion can be achieved by an envelopment which electromagnetically shields and completely surrounds, spatially and three-dimensionally and from a technical point of view, the first housing interior subregion, which completely or virtually completely damps electromagnetic radiation and therefore does not allow said electromagnetic radiation to pass into a housing interior subregion, or not with an intensity that can trigger functional faults in the first components located in this region.

Owing to the fact that the housing interior is divided into at least two housing interior subregions and owing to the electromagnetic shielding between these two housing interior subregions with the aid of the electromagnetically shielding envelopment, the first electromagnetically sensitive components and the second components which generate electromagnetic interference fields can be arranged separated from one another in the two housing interior subregions which are electromagnetically shielded from one another. In this case, it is possible to dispense with dedicated, individual housings for the components which are intended to protect the first components from the electromagnetic interference fields or to prevent the electromagnetic interference fields generated in the second components from passing to the outside. Such housing-less components require a comparatively much smaller amount of installation space in the housing of the circuit arrangement. As a result, the housing of the circuit arrangement can have smaller dimensions.

In this case, the spatial separation of the two housing interior subregions is realized simply primarily by means of a separating wall, which divides the housing interior into the two housing interior subregions and damps the electromagnetic radiation from the second components. By virtue of this spatial separation, the possibility is therefore also provided of realizing electromagnetic shielding.

In order to further reduce the installation space, in addition part of the housing, namely a housing section, is included for spatially separating and for forming the electromagnetically shielding envelopment between the two housing interior subregions. In this case, the housing section is designed in such a way that it likewise damps the electromagnetic radiation from the second components and therefore does not allow said electromagnetic radiation to pass through, or not with an intensity that can trigger functional faults in the first components.

In order to largely completely separate and electromagnetically shield the first housing interior subregion from the second housing interior subregion, a covering plate is used which envelopes, with the separating wall and the housing section, the first housing interior subregion three-dimensionally and completely and therefore enables largely complete electromagnetic shielding of the first housing interior subregion from the second housing interior subregion. In this case, the covering plate is likewise designed in such a way that it damps the electromagnetic radiation from the second components. In this case, the separating wall and the covering plate can be in the form of thin plates which take up a negligibly small amount of installation space which is of no consequence owing to the saving made in the case of the otherwise required housings of the components.

Since the electromagnetic shielding is realized partially by means of the housing section which, as part of the housing, does not take up any additional installation space, the installation space in the housing is further reduced. Since the separating wall and the covering plate can be produced more easily and at less cost in comparison with the individual housings of the components, the circuit arrangement as a whole can be produced in a more favorable manner.

As a result, a housing for a circuit arrangement is provided with which inexpensive and effective electromagnetic shielding of the electromagnetically sensitive components of the circuit arrangement which saves on installation space is made possible.

In accordance with a preferred configuration, the covering plate, the separating wall and the housing section are electrically conductively and mechanically connected to one another. This ensures an impact-resistant and vibration-resistant connection between the covering plate and the housing and reliable electrical shielding.

In this case, an "electrically conductive mechanical connection" means a mechanical, fixed connection between two parts which at the same time produces a low-resistance electrical connection between these two parts, wherein, owing to this connection, when a voltage is applied between these two connected parts, the voltage difference between the parts would fall to a value close to zero. In this case, the electrically conductive and mechanical connection is formed via a direct physical contact between the two connected parts. Such a connection can be produced, for example, via a cohesive connection such as, for example, a soldered joint, an electrically conductive adhesive joint or welded joint or via a form-fitting connection by means of electrically conductive screwing or riveting.

In accordance with a further preferred configuration, the covering plate, the separating wall and/or the housing section are designed to be electrically conductively connected to an electrical terminal, in particular a ground terminal, of the first component. For this purpose, the covering plate, the separating wall and/or the housing section are formed with at least one corresponding electrical terminal.

In this case, an "electrical connection" means a low-resistance electrical connection between two parts, wherein, owing to this connection, when a voltage is applied between these two parts, the voltage difference between the parts would fall to a value close to zero.

This configuration provides the advantage that the covering plate, the separating wall and/or the housing section can be used, in addition for electromagnetic shielding, also as an electrical connection between the electrical terminal of the component and an external circuit unit, for example between the ground terminal of the component and an external ground. Therefore, the covering plate, the separating wall and/or the housing section perform two functions simultaneously and, as a result, an additional electrical line which would otherwise be required for an electrical connection between the electrical terminal of the component and the external circuit unit is not required.

In accordance with a further preferred configuration, the covering plate is designed to be electrically conductively and mechanically connected directly to the first component via the mentioned electrical terminal. For this purpose, the covering plate has at least one electrical terminal which is designed so as to be both electrically and mechanically connectable to the mentioned electrical terminal of the first component.

This configuration provides the advantage that the covering plate can at the same time also act as a carrier of the first component. Thus, an additional circuit carrier for mechanically fastening the first component and for producing an electrical connection between this component and the external circuit unit is not required.

In accordance with yet a further preferred configuration, the separating wall, the covering plate and/or the housing section comprise electrically conductive and/or soft-magnetic material. Preferably, the separating wall, the covering plate and/or the housing section are formed from the same electrically conductive and/or soft-magnetic material.

The last-mentioned configurations ensure effective electromagnetic shielding of the first component. By using one and the same electrically conductive and/or soft-magnetic material, the production costs are reduced further.

In accordance with yet a further preferred configuration, the separating wall and the housing section are formed integrally. Preferably, the entire housing is formed integrally with the separating wall. In this case, the housing can be produced in a casting operation, such as injection molding, for example, wherein the separating wall is formed integrally at the housing section with this housing section or the housing during the casting operation for the housing. As a result, the housing or the housing section can be produced inexpensively together with the separating wall as a mass-produced product.

In accordance with yet a further preferred configuration, the separating wall completely envelopes, encompasses or surrounds the first housing interior subregion. As a result, the separating wall forms a shell in the form of a jacket around the first housing interior, in which the first component can be arranged.

Other embodiments provide a circuit arrangement that comprises the housing already described above, the first electrical component in the form of a filter component and the second electrical or electronic component. In this case, the first component is arranged in the first housing interior subregion of the housing and the second component is arranged in the second housing interior subregion of the housing.

In particular, the circuit arrangement can be in the form of a current/voltage transformer or a power converter for converting electric current from one type of current into another type of current, in particular in the form of an inverter or a rectifier. The first electrical component in the form of a filter component can in this case be an EMC filter or part of the EMC filter.

In a preferred configuration of the circuit arrangement, the first component comprises the electrical terminal for producing an electrically conductive connection to an electrical ground potential and is electrically conductively and mechanically connected directly via this electrical terminal to the covering plate.

In this case, a "direct electrically conductive and mechanical connection" means an electrical and mechanical connection of parts physically abutting one another which contains, if appropriate, an electrically conductive layer between the two connected parts, which electrically conductive layer is in the form of a soldered joint, adhesive joint or welded joint layer, for example, and electrically and mechanically connects the two parts to one another.

In accordance with yet a further preferred configuration of the circuit arrangement, the first component is fastened on the covering plate via a mechanical connection, wherein this mechanical connection at the same time forms the above-mentioned electrical connection, which electrically conductively connects the electrical terminal of the first component directly to the covering plate.

In accordance with yet a further preferred configuration, the first component is in the form of a capacitor or a coil. In this case, the capacitor or the coil is part of an EMC filter, for example.

Other embodiments provide a drive arrangement for a vehicle, which drive arrangement has an electric machine for driving the vehicle and an above-described circuit arrangement. In this case, the circuit arrangement is electrically connected to the electric machine via an electrical connection and provides electric energy in the form of rotor or stator currents to the electric machine.

Other embodiments provide a method for producing an above-described circuit arrangement, said method having the following method steps. An electrically conductive mechanical connection between the first electrical component and the covering plate is produced. Once the electrically conductive mechanical connection between the first component and the covering plate has been produced, the covering plate together with the component is fastened on the separating wall and/or the housing section of the housing.

Advantageous configurations of the above-described housing, insofar as they are transferable at all to the above-mentioned circuit arrangement, drive arrangement or the above-mentioned method, should also be regarded as advantageous configurations of the circuit arrangement, the drive arrangement or the method.

Reference is first made to FIG. 1, in which a vehicle FZ having wheels R and a drive arrangement AA for driving the wheels R is illustrated schematically.

The drive arrangement AA comprises a drive shaft AW, an electric machine EM, a circuit arrangement in the form of a power converter SR and an electrical energy store ES.

The drive shaft AW connects the electric machine EM to the wheels R and transmits the mechanical energy generated by the electric machine EM to the wheels R for driving said wheels. The electric machine EM is connected to the power converter SR via an electrical connection EV. The power converter SR is in turn connected to the energy store ES via a further electrical connection EV, said energy store providing electrical energy for the electric machine EM for the operation thereof. The electrical energy provided by the energy store ES in the form of direct current is converted by the power converter SR in a manner known to a person skilled in the art into phase currents for operating the electric machine EM and is provided to the electric machine EM. The electric machine EM converts the electrical energy into mechanical energy and drives the wheels R and therefore the vehicle FZ via the drive shaft AW.

Figure 2:
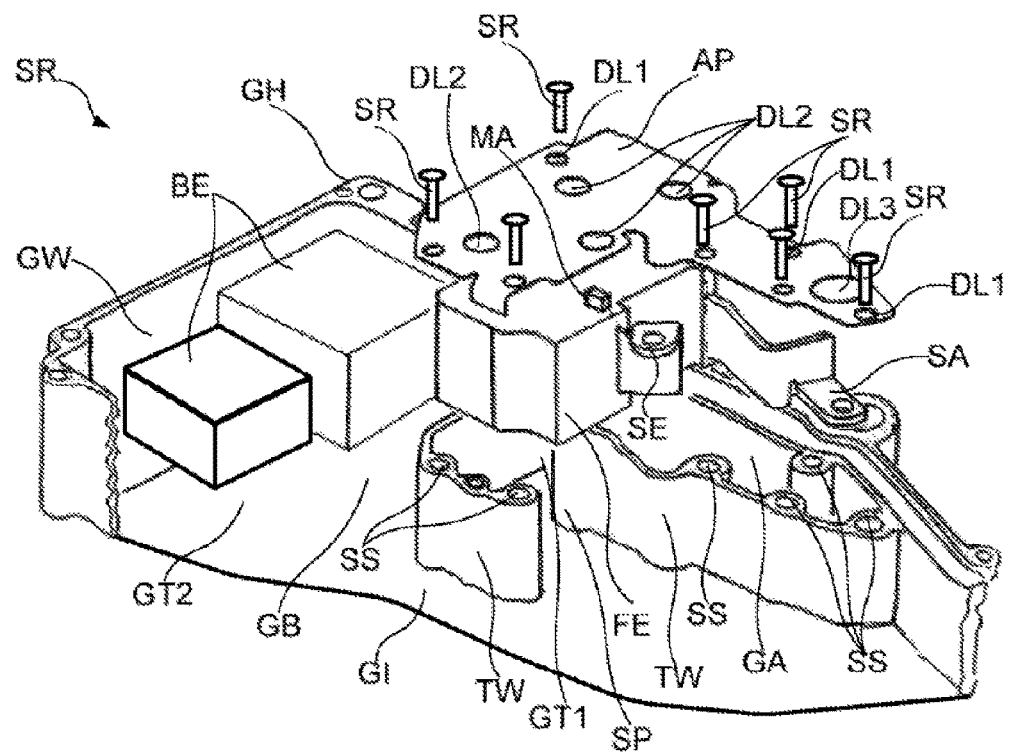
FIG. 2 shows a schematic exploded illustration of the circuit arrangement of the embodiment.

The mechanical design of the power converter SR is shown schematically, partially in section, in FIG. 2 in a schematic exploded illustration.

In this case, the power converter SR has a housing GH and a housing cover (not illustrated in the figure). The housing GH comprises a housing side wall GW and a housing base GB and has a trough-shaped housing interior GI for accommodating electrical and electronic components of the power converter SR.

The power converter SR furthermore comprises, as electrical and electronic components, an EMC filter comprising a filter component FE, which in this embodiment comprises a group of capacitors, and a bridge circuit comprising further electrical and electronic components BE, such as switching transistors, for example.

The filter component FE or the EMC filter suppresses undesired disruptive voltage signal components in the direct current provided by the energy store ES during operation of the power converter SR and therefore contributes to the electromagnetic compatibility of the power converter SR. For this purpose, the filter component FE has a current input terminal SE for drawing direct current on which disruptive voltage signal components are superimposed and a current output terminal SA for outputting the filtered direct current as well as a plurality of ground electrical terminals MA for the electrical connection to ground.

The further electrical and electronic components BE such as the switching transistors in the power converter SR generate electrical or electromagnetic interference fields during operation of the power converter SR, which interference fields can lead to functional faults in the filter component FE and even to failure of the filter component FE.

In order to protect the filter component FE from the electrical or electromagnetic interference fields of the surrounding components BE of the power converter SR, the power converter SR is provided with a covering plate AP consisting of an electrically conductive and soft-magnetic material. In addition, the housing GH is formed from an electrically conductive and soft-magnetic material and is provided with a separating wall TW in the form of ribs, which separating wall is formed integrally with the housing GH and is formed as an extension of the housing side wall GW of the housing GH so as to extend into the housing interior GI and therefore likewise consists of the electrically conductive and soft-magnetic material.

In this case, this separating wall TW divides the housing interior GI into a first housing interior subregion GT1 and a second housing interior subregion GT2 and delimits, with a housing section GA, the first housing interior subregion GT1 from the second housing interior subregion GT2. In this case, the housing section GA comprises part of the housing side wall GW and part of the housing base GB.

In an assembled state, the filter component FE is arranged in the first housing interior subregion GT1 and spatially separated from the further electrical or electronic components BE which are arranged in the second housing interior subregion GT2.

In this assembled state, the covering plate AP is arranged on the separating wall TW and the housing section GA and is fastened, by means of electrically conductive screws SR, to the separating wall TW or the housing section GA, and therefore is electrically conductively connected to the separating wall TW or the housing section GA. In this case, the covering plate AP, the separating wall TW and the housing section GA surround the first housing interior subregion GT1 in such a way that electrical or electromagnetic interference fields which are generated by the components BE arranged in the second housing interior subregion GT2 are damped by the covering plate AP, the separating wall TW and the housing section GA and therefore do not pass into the first housing interior subregion GT1, or not with an intensity, and cannot trigger faults or even damage in the filter component FE.

In order to fasten it to the separating wall TW or to the housing section GA, the covering plate AP has a group of first through-holes DL1 at corresponding points over the periphery of the covering plate AP. Correspondingly, the separating wall TW and the housing section GW are provided with corresponding screw shafts SS for receiving and holding screws SR at corresponding points. In order to fasten the covering plate AP to the separating wall TW and the housing section GW, the screws SR are passed through the first through-holes DL1 and screwed into the respective screw shafts SS. In this case, the screw connection between the covering plate AP and the separating wall TW or the housing section GW is produced with a sufficiently high number of screws SR at small distances from one another. The distance between the screws is, for example, less than 20, 15, 10, 8 or 5 times the diameter of the screws SR used. In particular, the screws SR are screwed at comparatively even smaller distances from one another in the region where an electrical connection is passed to the current output terminal SA for passing on the filtered interference signal-free direct current. As a result, a low-resistance electrical connection from the covering plate AP to the separating wall TW and the housing section GW is achieved.

In the assembled state of the power converter SR, the filter component FE is fastened on the covering plate AP, wherein the filter component FE is electrically conductively and mechanically connected via soldered joints between the ground electrical terminals MA of the filter component FE and connection points provided for this on the covering plate AP to the covering plate AP. In this case, the connection points on the covering plate AP are in the form of second through-holes DL2. The pin-shaped ground terminals MA of the filter component FE protrude through these second through-holes DL2 and are mechanically and electrically conductively connected to the covering plate AP by means of soldered joints. The ground terminals MA are furthermore connected to the electrical ground via the covering plate AP, the electrically conductive separating wall TW and the electrically conductive housing section GW.

The covering plate AP therefore acts as circuit carrier for the filter component FE for mechanically fastening the filter component FE and for producing electrical connections between the ground terminals MA of the filter component FE and the electrical ground. The covering plate AP, the separating wall TW and the housing section GW therefore produce a flat electrical connection between the filter component FE and the electrical ground.

The circumference of the second through-holes DL2 is additionally greater than that of the cross section of the ground terminals MA, with the result that the manufacturing tolerances can be compensated for between the filter component FE and the covering plate AP.

The separating wall TW has a narrow gap SP at one point as an interruption in the separating wall TW, which narrow gap is used for introducing a cable (not illustrated in the figure) into the first housing interior subregion GT1, which cable connects the current input terminal SE of the filter component FE to the energy store ES electrically. In this case, the gap SP is arranged at a point on the separating wall TW which is remote from the components BE, based on a wall region of the separating wall TW, with the result that the electromagnetic interference fields which are emitted by the components BE can be absorbed by this wall region of the separating wall TW and therefore cannot even pass to the gap SP.

In addition, the separating wall TW has a labyrinth-like formation, wherein the gap SP forms the inlet of the labyrinth. Owing to the labyrinth-like bends and turns in the separating wall TW and the arrangement of the filter components FE behind these bends and turns in the separating wall TW, the electromagnetic interference fields are absorbed and damped by the separating wall TW before they pass to the filter components FE.

Similarly, the covering plate AP has a cutout in the form of a third through-hole DL3, which is used for inserting a further cable (not illustrated in the figure) into the first housing interior subregion GT1, which cable electrically connects the current output terminal SA of the filter component FE to the components BE of the bridge circuit.

Figure 3:
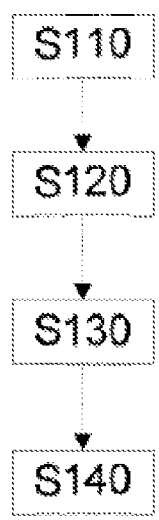
FIG. 3 shows a schematic diagram illustrating the method for producing the circuit arrangement of disclosed embodiments.

A method for producing the above-described power converter SR will be described in more detail below with reference to a diagram illustrated schematically in FIG. 3.

In order to produce the power converter SR, in accordance with a method step S110 the housing GH is produced in an injection-molding process, wherein the separating wall TW is formed on the housing GH during the injection-molding of the housing GH.

In accordance with a further method step S120, the covering plate AP is placed on the filter component FE and is electrically conductively and mechanically connected to the filter component FE. In this case, the ground terminals MA of the filter component FE are soldered to the connection points on the covering plate AP in a soldering process, which connection points are provided for this purpose and are formed in advance in the form of second through-holes DL2.

Once the soldered joints between the filter component FE and the covering plate AP have been produced, the covering plate AP together with the filter component FE is arranged, in accordance with a subsequent method step S130, in the first housing interior subregion GT1 and fastened on the separating wall TW and the housing section GW of the housing GH. In this case, the covering plate AP, the separating wall TW and the housing section GW are provided in advance with first through-holes DL1 or with screw shafts SS at corresponding points. The covering plate AP is then fastened to the separating wall TW or the housing section GW by means of screws SR, wherein the screws SR consist of an electrically conductive material and therefore produce, in addition to the mechanical connection, also a low-resistance electrical connection between the covering plate AP or the ground terminal MA of the filter component FE and the separating wall TW as well as the housing section GW or the electrical ground.

Preferably, the further electrical or electronic components BE in the bridge circuit are arranged in the second housing interior subregion GT2 in the same fastening process in accordance with method step S130 and are fastened on the housing base GB or on the housing side wall GW in a manner known to a person skilled in the art.

Then, the housing cover is screwed onto the housing GH in air-tight fashion in accordance with a subsequent method step S140.

What is claimed is:

1. A housing for a circuit arrangement, the housing comprising:
   a housing interior;
   a separating wall impermeable to electromagnetic radiation and which divides the housing interior spatially into a first housing interior subregion and a second housing interior subregion, wherein the first housing interior subregion is configured to accommodate a first electrical component comprising a filter component, and the second housing interior subregion is configured to accommodate a second electrical component;
   a gap defined by the separating wall providing access to a labyrinthine path for a cable running from the first housing interior subregion to the second housing interior subregion;
   a covering plate impermeable to electromagnetic radiation; and
   a housing section impermeable to electromagnetic radiation and which directly adjoins the first housing interior subregion;
   wherein the separating wall, the covering plate, and the housing section surround the first housing interior subregion three-dimensionally to thereby provide complete electromagnetic shielding of the first housing interior subregion from the second housing interior subregion.

2. The housing of claim 1, wherein the covering plate, the separating wall, and the housing section are electrically conductively and mechanically connected to one another.

3. The housing of claim 1, wherein at least one of the covering plate, the separating wall, or the housing section is configured to be electrically conductively connected to an electrical terminal of the first component.

4. The housing of claim 3, wherein the covering plate is configured to be electrically conductively and mechanically connected directly to the first component via the electrical terminal.

5. The housing of claim 1, wherein at least one of the separating wall, the covering plate, or the housing section comprise material that is at least one of electrically conductive or soft-magnetic.

6. The housing of claim 5, wherein the separating wall, the covering plate, and the housing section are formed from the same material.

7. The housing of claim 1, wherein the separating wall and the housing section are formed integrally.

8. The housing of claim 1, wherein the separating wall surrounds the first housing interior subregion.

9. A circuit arrangement comprising:
   a housing comprising:
   a housing interior;
   a separating wall impermeable to electromagnetic radiation and which divides the housing interior spatially into a first housing interior subregion and a second housing interior subregion;
   a gap defined by the separating wall providing access to a labyrinthine path for a cable running from the first housing interior subregion to the second housing interior subregion;
   a covering plate impermeable to electromagnetic radiation; and
   a housing section impermeable to electromagnetic radiation and which directly adjoins the first housing interior subregion;
   wherein the separating wall, the covering plate, and the housing section surround the first housing interior subregion three-dimensionally to thereby provide complete electromagnetic shielding of the first housing interior subregion from the second housing interior subregion;
   a first electrical component comprising a filter component arranged in the first housing interior subregion; and
   a second electrical component arranged in the second housing interior subregion.

10. The circuit arrangement of claim 9, wherein the first component has an electrical terminal for producing an electrically conductive connection to an electrical ground potential and is electrically conductively connected directly via this electrical terminal to the covering plate, the separating wall, or the housing section.

11. The circuit arrangement of claim 9, wherein the first component is fastened on the covering plate via a mechanical connection that forms an electrical connection that electrically conductively connects the electrical terminal of the first component to the covering plate.

12. The circuit arrangement of claim 9, wherein the first component comprises a capacitor or a coil.

13. A drive arrangement for a vehicle, the drive arrangement comprising:
   an electric machine for driving the vehicle, and a circuit arrangement comprising:
   a housing comprising:
   a housing interior;
   a separating wall impermeable to electromagnetic radiation and which divides the housing interior spatially into a first housing interior subregion and a second housing interior subregion;

a gap defined by the separating wall providing access to a labyrinthine path for a cable running from the first housing interior subregion to the second housing interior subregion;

a covering plate impermeable to electromagnetic radiation; and a housing section impermeable to electromagnetic radiation and which directly adjoins the first housing interior subregion;

wherein the separating wall, the covering plate, and the housing section surround the first housing interior subregion three-dimensionally to thereby provide complete electromagnetic shielding of the first housing interior subregion from the second housing interior subregion;

a first electrical component comprising a filter component arranged in the first housing interior subregion; and a second electrical component arranged in the second housing interior subregion;

wherein the circuit arrangement is connected to the electric machine via an electrical connection to thereby provide electrical energy to the electric machine.

14. A method for producing a circuit arrangement including (a) a housing having a housing interior, a radiation-impermeable separating wall dividing the housing interior spatially into a first housing interior subregion and a second housing interior subregion, a gap defined by the separating wall providing access to a labyrinthine path for a cable running from the first housing interior subregion to the second housing interior subregion, a radiation-impermeable covering plate, and a radiation-impermeable housing section that directly adjoins the first housing interior subregion, wherein the separating wall, the covering plate, and the housing section surround the first housing interior subregion three-dimensionally to thereby provide complete electromagnetic shielding of the first housing interior subregion from the second housing interior subregion, (b) a first electrical component comprising a filter component arranged in the first housing interior subregion, and (c) a second electrical component arranged in the second housing interior subregion, wherein the method comprises:

producing an electrically conductive mechanical connection between the first electrical component and the covering plate; and fastening the covering plate to at least one of the separating wall or the housing section once the electrically conductive mechanical connection between the first component and the covering plate has been produced.

15. The method of claim 14, wherein the electrically conductive mechanical connection between the first electrical component and the covering plate is produced with the aid of an electrically conductive mechanical connection between the electrical terminal of the first electrical component and the covering plate, wherein the electrical terminal is configured to produce an electrically conductive connection to an electrical ground potential.

* * * * *